(12) United States Patent
Ikeda

(10) Patent No.: US 6,654,300 B2
(45) Date of Patent: Nov. 25, 2003

(54) SEMICONDUCTOR MEMORY DEVICE HAVING INTERNAL CIRCUIT SCREENING FUNCTION

(75) Inventor: Yutaka Ikeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/216,751

(22) Filed: Aug. 13, 2002

(65) Prior Publication Data

US 2003/0151961 A1 Aug. 14, 2003

(30) Foreign Application Priority Data

Feb. 13, 2002 (JP) ........................................ 2002-035464

(51) Int. Cl.[7] ................................................ G11C 7/00
(52) U.S. Cl. ........................ 365/201; 365/226; 365/189
(58) Field of Search ................................. 365/201, 226, 365/189.09; 323/313, 314

(56) References Cited

U.S. PATENT DOCUMENTS 6,424,134 B2 * 7/2002 Morishita et al. ............ 323/313
6,449,208 B1 * 9/2002 Kono et al. .................. 365/226
6,498,469 B2 * 12/2002 Kobayashi ................... 323/313

* cited by examiner

*Primary Examiner*—Anh Phung
(74) *Attorney, Agent, or Firm*—McDermott, Will & Emery

(57) ABSTRACT

A semiconductor memory device includes an internal voltage generation circuit controlling an internal voltage supplied to an internal circuit in accordance with a reference voltage, a reference voltage generation circuit generating the reference voltage, a plurality of signal terminals for transmitting and receiving a signal to and from an outside of the semiconductor memory device, and a reference voltage change indication circuit for indicating a change of the reference voltage on the basis of a binary input signal to each of the signal terminals with respect to the reference voltage generation circuit during a test.

5 Claims, 9 Drawing Sheets

FIG.7A

|  | COUNTER 500a | COUNTER 500b | COUNTER 500c | COUNTER 500d |
|---|---|---|---|---|
| INITIAL STATE LEVEL 0 | L | L | L | L |
| LEVEL +1 | H | L | L | L |
| LEVEL +2 | L | H | L | L |
| LEVEL +3 | H | H | L | L |
| LEVEL +4 | L | L | H | L |
| LEVEL +5 | H | L | H | L |
| LEVEL +6 | L | H | H | L |
| LEVEL +7 | H | H | H | L |

FIG.7B

|  | COUNTER 500a | COUNTER 500b | COUNTER 500c | COUNTER 500d |
|---|---|---|---|---|
| INITIAL STATE LEVEL 0 | L | L | L | L |
| LEVEL −1 | H | H | H | H |
| LEVEL −2 | L | H | H | H |
| LEVEL −3 | H | L | H | H |
| LEVEL −4 | L | L | H | H |
| LEVEL −5 | H | H | L | H |
| LEVEL −6 | L | H | L | H |
| LEVEL −7 | H | L | L | H |

SEMICONDUCTOR MEMORY DEVICE HAVING INTERNAL CIRCUIT SCREENING FUNCTION

BACKGROUND OF THE INVENTION

1. Field of the Invention

The present invention relates to a semiconductor memory device and particularly relates to an internal voltage generation circuit capable of adjusting internal voltage during a test.

2. Description of the Background Art

Generally, periods in which failures occur to a semiconductor memory device are roughly divided into three periods, which periods are also referred to as a an initial failure period, a chance failure period and a wear-out failure period in the order of time.

In the initial failure period, a defect at the time of the manufacture of a semiconductor memory device appears as a failure. The initial failure period is a period in which an initial failure occurs right after starting the use of the semiconductor. The rate of this initial failure sharply decreases with the passage of time. The initial failure period is followed by the chance failure period in which a low failure rate continuous for a certain period of time. With time, the life of the semiconductor memory device nears the useful life thereof and the semiconductor memory device enters the wear-out failure period in which the failure rate suddenly increases. If the operation reliability of the semiconductor memory device while being in use is considered, it is necessary to use the semiconductor memory device within the chance failure period. Namely, it is necessary to remove semiconductor memories to which initial failures occur before shipment. To this end, semiconductor memories are subjected to accelerated operation aging for a certain period of time and to screening for removing defects having initial failures.

To perform efficient screening, it is necessary to discover an initial failure in short time. Generally, a screening method for raising internal voltage which is used as operating power supply voltage in semiconductor memory device from voltage in normal operation, applying high field stress to the memory and thereby screening semiconductor memories is used.

FIG. 8 is a conceptual view of a conventional internal voltage generation circuit 20 which generates internal voltage applied to the internal circuit of a semiconductor memory device.

Referring to FIG. 8, internal voltage generation circuit 20 includes reference voltage generation circuits 300a to 300c which generate reference voltages REF1 to REF3, respectively, and internal voltage generation units 400a to 400c which receive corresponding to reference voltages REF1 to REF3, and generate internal voltages V1 to V3 respectively.

FIG. 9 is a circuit block diagram of reference voltage generation circuit 300a generating reference voltage REF1. Since reference voltage generation circuits 300a to 300c are equal in configuration, the configuration of reference voltage generation circuit 300a will be typically explained herein.

Referring to FIG. 9, reference voltage generation circuit 300a includes a current mirror amplifier 310, a starting circuit 320 which operates at startup, a constant current circuit 330 which generates a constant current, a tuning circuit 340 and a reference voltage setting circuit 350.

Reference voltage setting circuit 350 sets the voltage level of an internal node to be described later. Current mirror amplifier 310 generates a reference voltage in accordance with the voltage level of this internal node. Tuning circuit 340 and constant current circuit 330 are used to adjust the voltage level of the internal node. Constant current circuit 330 supplies a constant current to reference voltage setting circuit 350, and tuning circuit 340 adjusts a resistance element to be described later and tunes the voltage level of the internal node. Starting circuit 320 indicates the activation of constant current circuit 330 when the power of the semiconductor memory device is turned on.

Current mirror amplifier 310 includes P-channel MOS transistors 311 and 312, and N-channel MOS transistors 313 to 315. P-channel MOS transistor 311 and N-channel MOS transistor 313 are connected in series between a power supply voltage VCC and a node N1 through a node N2 and the gates of P-channel MOS transistors 311 and N-channel MOS transistor 313 are connected to node N2 and an internal node N6, respectively. P-channel MOS transistor 312 and N-channel MOS transistor 314 are connected in series between power supply voltage VCC and node N1 through a node N0 and the gates of P-channel MOS transistors 312 and N-channel MOS transistor 314 are connected to node N2 and node N0, respectively. Further, N-channel MOS transistor 315 is connected between node N1 and a ground voltage GND and the gate thereof is connected to a node N4.

By such a current mirror structure, current mirror amplifier 310 sets reference voltage REF1 generated at node N0 at the voltage level of voltage Vn6 of internal node N6 connected to the gate of N-channel MOS transistor 313.

Starting circuit 320 includes a P-channel MOS transistor 321 and an N-channel MOS transistor 322.

P-channel MOS transistors 321 and N-channel MOS transistor 322 are connected between power supply voltage VCC and ground voltage GND through a node N3 and the gates of P-channel MOS transistors 321 and N-channel MOS transistor 322 are connected to ground voltage GND and a node N4, respectively.

At startup, starting circuit 320 raises the voltage level of node N3 in response to the rise of power supply voltage VCC. Following this, an N-channel MOS transistor 323 which is provided in constant current circuit 330 becomes conductive, nodes N4 and N5 are electrically connected to each other and constant current circuit 330 is activated. It is noted that starting circuit 320 turns N-channel MOS transistor 323 into a nonconductive state after the passage of a predetermined period. This is because the voltage level of node N3 decreases if N-channel MOS transistor 322 is conductive.

Constant current circuit 330 includes a resistance 332, P-channel MOS transistors 331 and 333, and N-channel MOS transistors 323, 334 and 335.

P-channel MOS transistors 331 and N-channel MOS transistor 334 are connected in series between power supply voltage VCC and ground voltage GND through node N5 and the gates of P-channel MOS transistors 331 and N-channel MOS transistor 334 are connected to nodes N5 and N4, respectively. Resistance 332, P-channel MOS transistors 333 and N-channel MOS transistor 335 are connected in series between power supply voltage VCC and ground voltage GND through node N4 and the gates of P-channel MOS transistors 333 and N-channel MOS transistor 335 are connected to nodes N5 and N4, respectively.

N-channel MOS transistor 323 is connected between nodes N4 and N5 and the gate thereof is connected to node N3. N-channel MOS transistors 334 and 335 constitute a current mirror circuit. If N-channel MOS transistors 334 and 335 have high channel resistances, the same current is carried to P-channel MOS transistors 331 and 333 by N-channel MOS transistors 334 and 335 which constitute a current mirror circuit.

Reference voltage setting circuit 350 includes P-channel MOS transistors 302 and 351 to 361, and an inverter 362.

P-channel MOS transistor 302 is connected between power supply voltage VCC and internal node N6 and the gate thereof is connected to node N5. P-channel MOS transistors 351 to 357 are connected in series between internal node N6 and ground voltage GND and the gates thereof are connected to ground voltage GND. P-channel MOS transistors 358 to 361 are provided as transistor switches so as to short-circuit P-channel MOS transistors 352 to 355, respectively (which P-channel MOS transistors 358 to 361 will be also referred to as "transistor switches" hereinafter), and the gates thereof receive the input of tuning circuit 340. The gate of P-channel MOS transistor 361 receives a signal input inverted from the output signal of tuning circuit 340 by inverter 362.

P-channel MOS transistor 302 has the same size (same ratio of channel width to channel length) as that of P-channel MOS transistor 331. A constant current Ict which is the same in magnitude as a current carried to P-channel MOS transistor 331, is carried to this P-channel MOS transistor 302.

The channel resistances of P-channel MOS transistors 351 to 357 causes voltage drop due to their resistance components. It is assumed herein that the channel resistances of P-channel MOS transistors 358 to 361 are sufficiently lower than those of P-channel MOS transistors 351 to 357.

Therefore, if a combined channel resistance of P-channel MOS transistors 351 to 357 is assumed as Rc, a constant voltage Vn6 generated at internal node N6 is expressed by the following equation.

$$Vn6 = Rc \cdot Ict.$$

Accordingly, constant voltage Vn6 can be adjusted by selectively setting transistor switches 358 to 361 and changing combined channel resistance Rc. As already described, the conductive states of P-channel MOS transistors 358 to 361 can be selectively set by tuning circuit 340.

FIG. 10 is a circuit block diagram of tuning circuit 340.

Referring to FIG. 10, tuning circuit 340 includes tuning units 344a to 344d which are provided to correspond to P-channel MOS transistors 358 to 361, respectively.

Since tuning units 344a to 344d are equal in configuration, tuning unit 344a will be typically described herein.

Tuning unit 344a includes a fuse element 343a which serves as a program element, an N-channel MOS transistor 341a, and an inverter 342a. Fuse element 343a and N-channel MOS transistor 341a are connected in series between power supply voltage VCC and ground voltage GND through a connection node Nh, and the gate of N-channel MOS transistor 341a is connected to node N4. In addition, inverter 342a inverts the signal transmitted to connection node Nh and transmits the inverted signal to the gate of P-channel MOS transistor 358.

Fuse element 343a is blown in response to the incidence of a laser beam applied from the outside of the memory and the state of fuse element 343a changes from a conductive state to a nonconductive state. As a result, tuning unit 344a changes the state of P-channel MOS transistor 358 from a conductive state to a nonconductive state when the fuse is blown. The same thing is true for remaining tuning units 344b to 344d.

Referring back to FIG. 9, a case where the channel resistance ratio of P-channel MOS transistors 352 to 355 is, for example, 1:2:4:8, will be considered.

In an initial state, transistor switches 358 to 360 are conductive and transistor switch 361 is nonconductive. Accordingly, P-channel MOS transistor 355 functions as a resistance element.

In this state, combined channel resistance Rc can be adjusted and constant voltage Vn6 can be raised or lowered in accordance with the tuning of tuning circuit 340 based on a predetermined combination of tuning units. It is, therefore, possible to correct the deviation of a target level which has been set in a design phase by conducting tuning to thereby blow fuse elements after designing the memory.

For example, in tuning circuit 340, if fuse element 343a is blown, P-channel MOS transistor 358 becomes nonconductive and P-channel MOS transistor 352 functions as a resistance element. As a result, combined channel resistance Rc increases and constant current Vn6 rises. Accordingly, the voltage level of the reference voltage in an initial phase is corrected to follow the target level of the reference voltage by tuning.

Reference voltage generation circuit 300a also includes an N-channel MOS transistor 301 and a DQM terminal as an external terminal, both of which are used during a test.

N-channel MOS transistor 301 is connected between DQM terminal and node N0 and the gate thereof receives a test mode signal TM which is activated to "H" level during a test. Namely, during a test, by inputting test mode signal TM, N-channel MOS transistor 301 can be turned into a conductive state and reference voltage REF1 can be inputted into transistor 301 directly from the outside of the memory using DQM terminal.

By adopting such a configuration, it is possible to directly input the reference voltage from the outside during a test, so that the internal voltage can be set at arbitrary level and a screening test can be easily executed. Further, the setting of the internal voltage during the test can be facilitated.

Nevertheless, as shown in three types of internal voltages V1 to V3 in FIG. 8, a semiconductor memory device is provided with a plurality of levels of internal voltages to correspond to various internal circuits, respectively. Therefore, it is necessary to provide many DQM terminals to input the reference voltage (REF1 in FIG. 9) so as to conduct a screening test in the configuration shown in FIGS. 9 and 10.

As already described, since it is necessary to fixedly input a constant voltage for a test into each DQM terminals as an external terminal, the DQM terminal cannot be used to input/output the other test signals. Because of the limited number of terminals, therefore, it is difficult to minutely adjust all the internal voltages during a test based on the configuration shown in FIG. 9.

Furthermore, since such a screening test is intended to accelerate the defect of an internal circuit, it is considered to suffice that the internal voltage can be slightly raised or lowered from the reference voltage which is set.

SUMMARY OF THE INVENTION

The present invention provides a semiconductor memory device capable of performing a screening test to internal circuits without directly inputting reference voltages from an outside of the semiconductor memory device and without increasing the number of external terminals during the test.

According to one aspect of the present invention, a semiconductor memory device includes: an internal voltage generation circuit; a reference voltage generation circuit; a plurality of signal terminals; and a reference voltage change indication circuit.

The internal voltage generation circuit controls an internal voltage supplied to an internal circuit in accordance with a reference voltage. The reference voltage generation circuit generates the reference voltage. The plurality of signal terminals transmit and receive a signal to and from an outside of the semiconductor memory device.

During a test, the reference voltage change indication circuit indicates a change of the reference voltage on the basis of a binary input signal to each of the signal terminals with respect to the reference voltage generation circuit.

Therefore, a main advantage of the present invention is to indicate a change of a reference voltage on the basis of a binary input signal to signal terminals during a test. Accordingly, it is possible to adjust an internal voltage without necessity for directly setting a level of a reference voltage with test dedicated external terminals and without increasing the number of the external terminals to efficiently perform a screening test.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7A is a view which shows the transition of the output signals of counters if up indication signals are sequentially inputted into counters;

FIG. 7B is a view which shows the transition of the output signals of counters if down indication signals are sequentially inputted into counters;

DESCRIPTION OF THE PREFERRED EMBODIMENT

Figure 1:
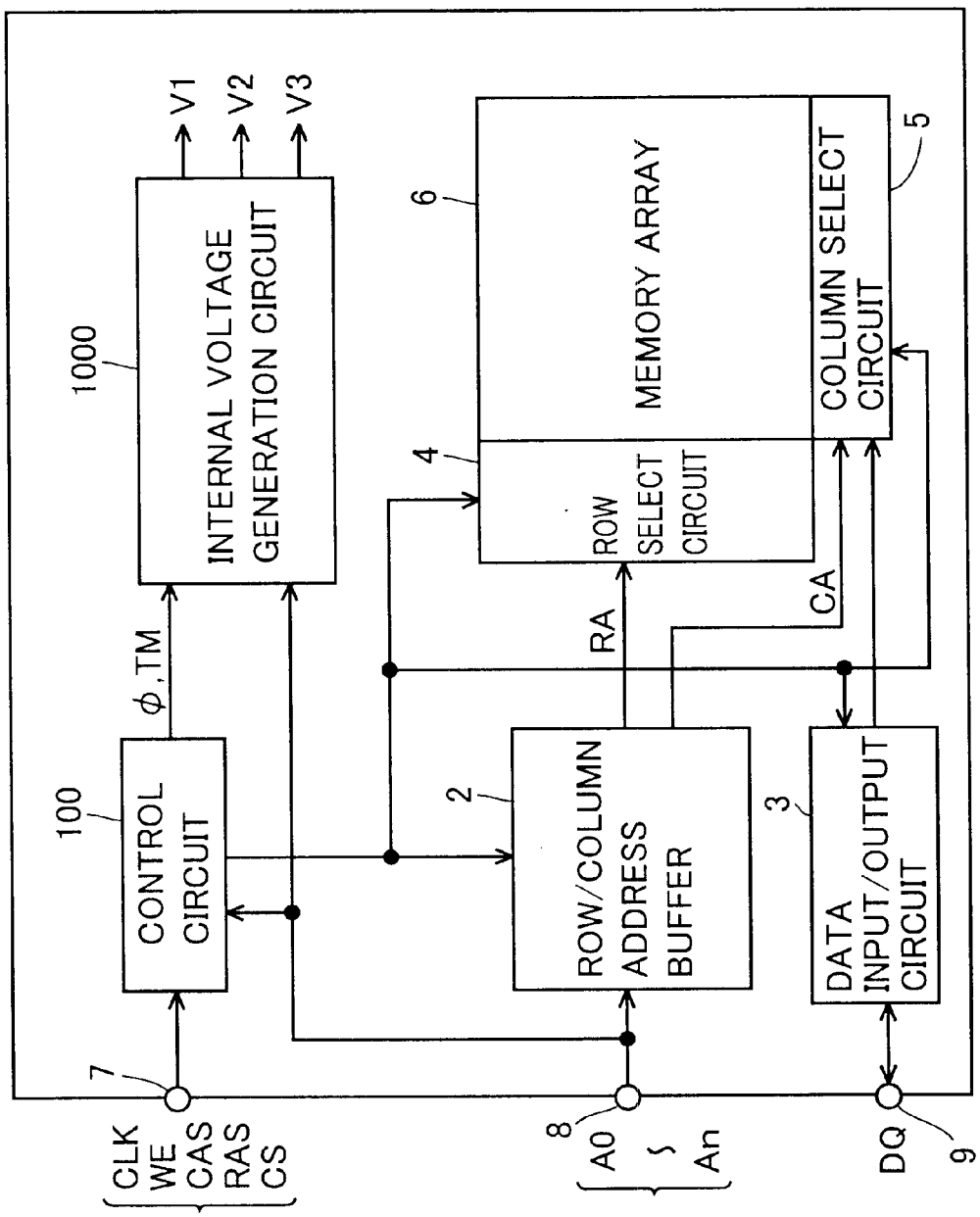
FIG. 1 is an overall block diagram of a semiconductor memory device 1 according to the present invention.

A embodiment of the present invention will be described hereinafter in detail with reference to the drawings. It is noted that the same or corresponding constituent elements are denoted by the same reference symbols in the drawings and will not be repeatedly described.

Referring to FIG. 1, a semiconductor memory device 1 executes random access in response to external control signals and address signals A0 to An (where n is a natural number), and executes the input/output of data DQ. The control signals include a clock signal CLK, a write enable signal WE which is a write permission signal, a column address strobe signal CAS for reading an address in a column direction at appropriate timing, a row address strobe signal RAS for reading an address in a row direction at appropriate timing, and a chip select signal CS for selecting a chip.

Semiconductor memory device 1 includes a control circuit 100 which controls overall semiconductor memory device 1 in response to the control signals and the like, a memory array 6 which includes a plurality of memory cells arranged in a matrix, a control terminal 7 which receives the input of the control signals, an address terminal 8 which receives the input of address signals A0 to An, and a data terminal 9 which is the input/output terminal of data DQ.

Semiconductor memory device 1 also includes a row/column address buffer 2, a row select circuit 4 and a column select circuit 5.

Row/column address buffer 2 receives address signals A0 to An and generate a row address RA and column address CA. Row select circuit 4 executes the selection of a row in memory array 6 in response to row address RA. Column select circuit 5 executes the selection of a column in memory array 6 in response to column address CA.

Semiconductor memory device 1 further includes a data input/output circuit 3 and an internal voltage generation circuit 1000.

Data input/output circuit 3 controls the input/output of data DQ and outputs data DQ inputted from data terminal 9 to column select circuit 5 in accordance with data written. In addition, data input/output circuit 3 outputs data DQ read by column select circuit 5 to data terminal 9 in accordance with data read. Internal voltage generation circuit 1000 generates internal voltages (V1, V2, V3 and the like) which are used as the power supply voltages of peripheral circuits, not shown, in semiconductor memory device 1. Further, the voltage levels of the internal voltages during a test are adjusted in accordance with a control signal ø and test mode signal TM outputted from control circuit 100.

Figure 2:
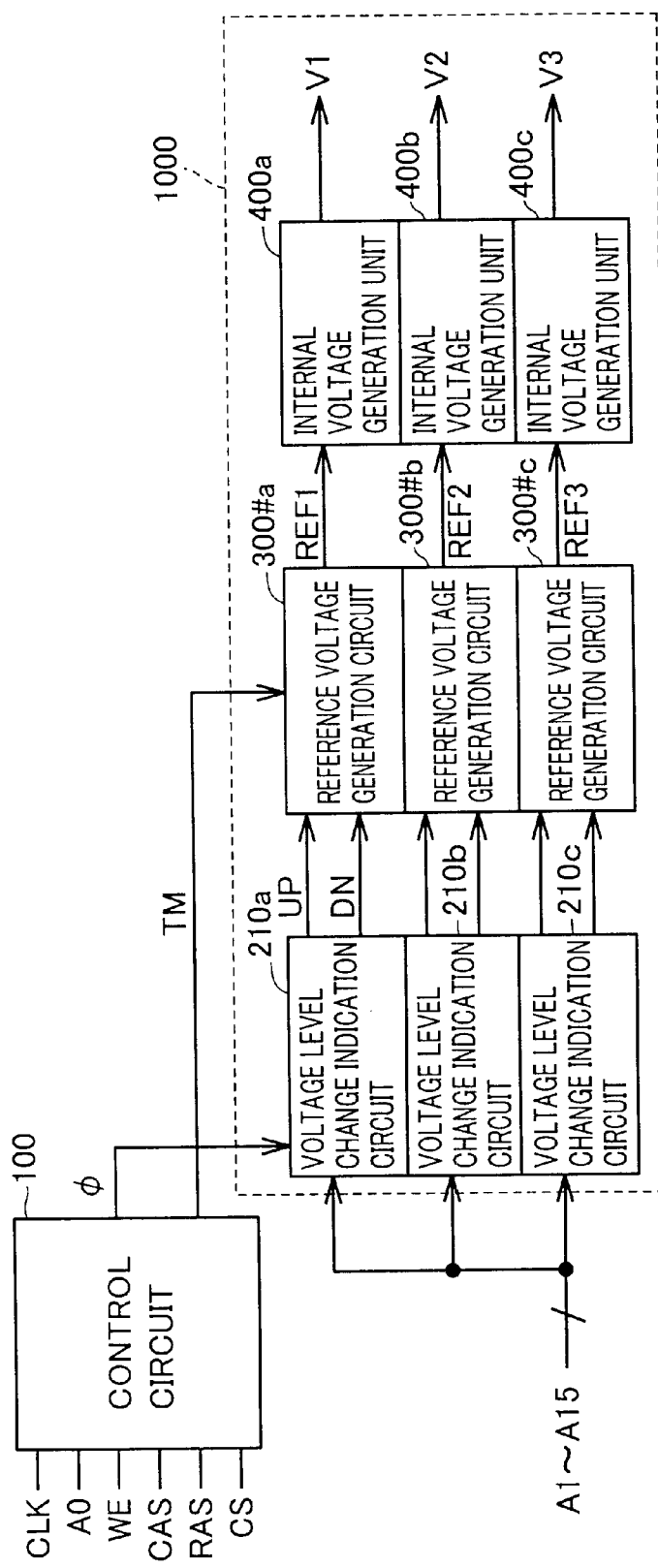
FIG. 2 is a block diagram showing the configuration of a control circuit and an internal circuit according to one embodiment of the present invention.

Referring to FIG. 2, control circuit 100 outputs control signal ø and test mode signal TM based on input according to a predetermined combination of the control signals (clock signal CLK, write enable signal WE, column address strobe signal CAS, row address strobe signal RAS and chip select signal CS) and address signal A0.

Internal voltage generation circuit 1000 includes voltage level change indication circuits 210*a* to 210*c* which indicates the rise or fall of reference voltages REF1 to REF3, respectively, based on address signals A1 to A15 and control signal o, reference voltage generation circuits 300#*a* to 300#*c* which generate reference voltages REF1 to REF3, respectively, and internal voltage generation units 400*a* to 400*c* which generate internal voltages V1 to V3 in accordance with reference voltage REF1 to REF3, respectively.

Figure 3:
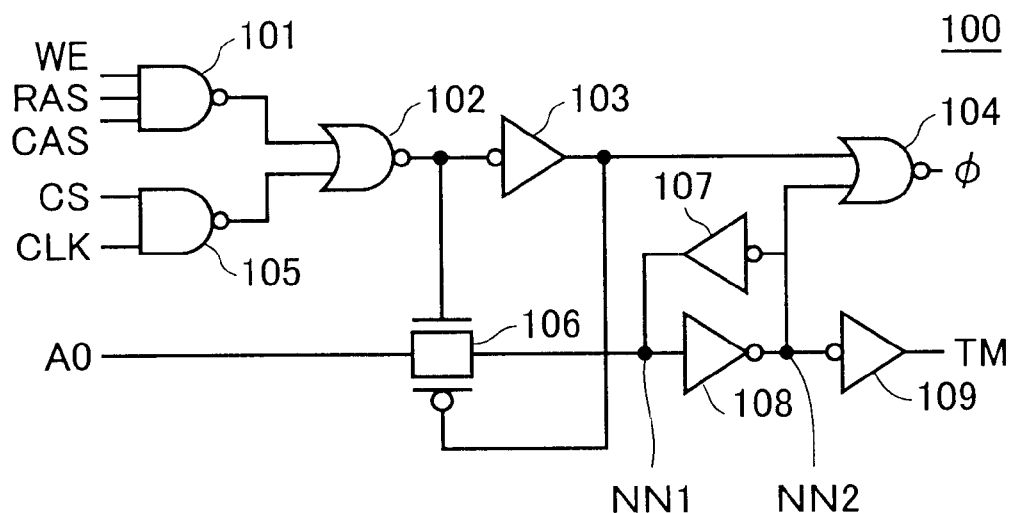
FIG. 3 is a circuit block diagram of the control circuit shown in FIG. 2.

Referring to FIG. 3, control circuit 100 generates control signal ø and test mode signal TM for indicating the internal operation of internal voltage generation circuit 1000 during a test in accordance with a predetermined combination of the control signals.

Control circuit 100 includes NAND circuits 101 and 105, NOR circuits 102 and 104, inverters 103 and 107 to 109, and a transfer gate 106. NAND circuit 101 receives the input of write enable signal WE, row address strobe signal RAS and column address strobe signal CAS, and outputs a NAND logic operation result for the both signals to NOR circuit 102. NAND circuit 105 receives the input of chip select signal CS and clock signal CLK, and outputs a NAND logic operation result for the both signals to NOR circuit 102.

Transfer gate 106 transmits address signal A0 to a node NN1 in response to the output signal of NOR circuit 102. Inverter 108 inverts the signal transmitted to a node NN1 and transmits the inverted signal to node NN2. Inverter 107 inverts the signal transmitted to a node NN2 and transmits the inverted signal to node NN1. Therefore, inverters 107 and 108 form a latch circuit. It is noted that inverter 107 is inferior to inverter 108 in driving capability.

Inverter 109 outputs, as test mode signal TM, the inverted signal of the signal transmitted to node NN2. In addition, NOR circuit 104 outputs a NOR logic operation result as control signal ø based on the inverted output signal of NOR circuit 102 through inverter 103 and the signal transmitted to node NN2.

For example, control signal ø and test mode signal TM are set to become "H" level when the control signals (WE, RAS, CAS, CS and CLK) and address signal A0 are all at "H" level. Otherwise, control signal ø and test mode signal TM are both set at "L" level.

Figure 4:
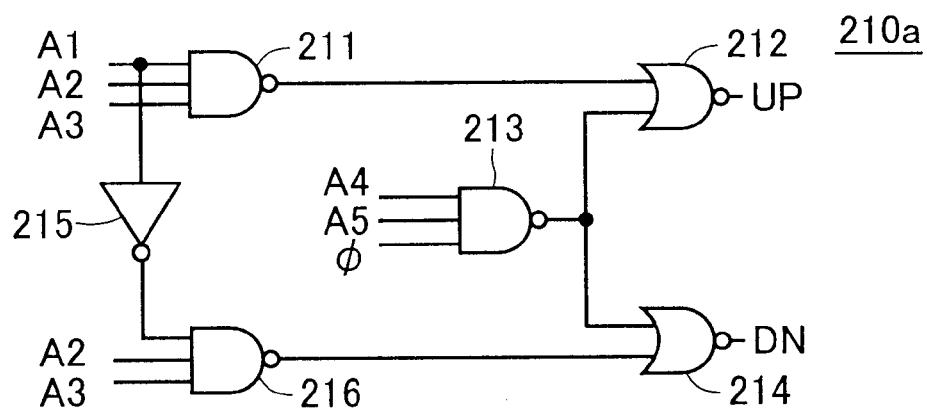
FIG. 4 is a circuit block diagram of a voltage level change indication circuit shown in FIG. 2.

Since voltage level change indication circuits 210a to 210c are equal in configuration, voltage level change indication circuit 210a will be typically described. Referring to FIG. 4, voltage level change indication circuit 210a generates an up indication signal UP indicating the rise of the voltage level of the reference voltage or a down indication signal DN indicating the fall of the voltage level of the reference voltage during a test based on address signals A1 to A5 and control signal ø.

Referring to FIG. 4, voltage level change indication circuit 210a includes NAND circuits 211, 213 and 216, NOR circuits 212 and 214, and an inverter 215.

NAND circuit 211 receives the input of address signals A1 to A3, and outputs a NAND logic operation result to one of the input sides of NOR circuit 212. NAND circuit 213 receives the input of address signals A4 and A5 and control signal ø, and outputs a NAND logic operation result to the input sides of both of NOR circuits 212 and 214. NAND circuit 216 receives the input of the inverted signal of address signal A1 inputted through inverter 215 and the input of address signals A2 and A3, and outputs a NAND logic operation result to one of the input sides of NOR circuit 214. NOR circuit 212 outputs a NOR logic operation result based on the input of NAND circuits 211 and 213 as up indication signal UP. NOR circuit 214 outputs a NOR logic operation result based on the input of NAND circuits 213 and 216 as down indication signal DN.

Voltage level change indication circuit 210a sets one of up indication signal UP and down indication signal DN at "H" level based on a predetermined combination of address signals A1 to A5. It is noted that control signal ø is an activation signal for activating voltage level change indication circuit 210a. That is, when control signal φ is at "L" level, both up indication signal UP and down indication signal DN are at "L" level irrespectively of the combination of address signals A1 to A5. Therefore, during operations other than a test, voltage level change indication circuit 210a does not indicate the rise or fall of the voltage level of the reference voltage.

For example, when address signals A1 to A5 and control signal ø are all at "H" level, up indication signal UP is set at "H" level. In response to this, the reference voltage during a test rises. When only address signal A1 is at "L" level and the other signals are all set at "H" level, down indication signal DN is set at "H" level. In response to this, the reference voltage falls during a test.

Since the same thing is true for remaining voltage level change indication circuits 210b and 210c, they will not be repeatedly described herein in detail. Voltage level change indication circuit 210b generates up indication signal UP and down indication signal DN in accordance with a predetermined combination of address signals A6 to A10. In addition, voltage level change indication circuit 210c generates up indication signal UP and down indication signal DN in accordance with a predetermined combination of address signals A11 to A15.

Figure 5:
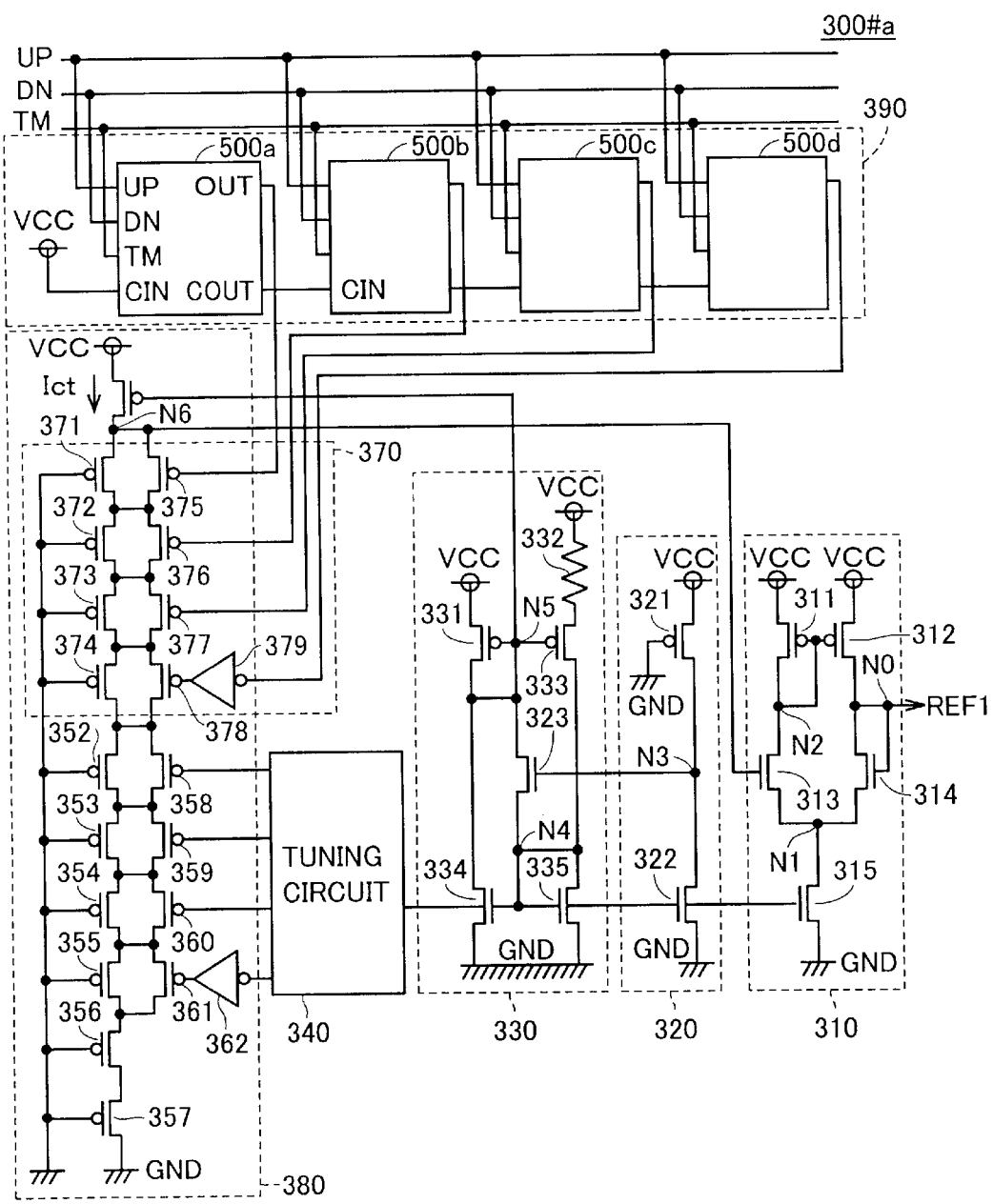
FIG. 5 is a circuit block diagram of a reference voltage generation circuit according to the embodiment of the present invention shown in FIG. 2.

Referring to FIG. 5, while reference voltage generation circuit 300#a will be typically described, reference voltage generation circuits 300#b and 300#c are equal in configuration to reference voltage generation circuit 300#a.

Figure 9:
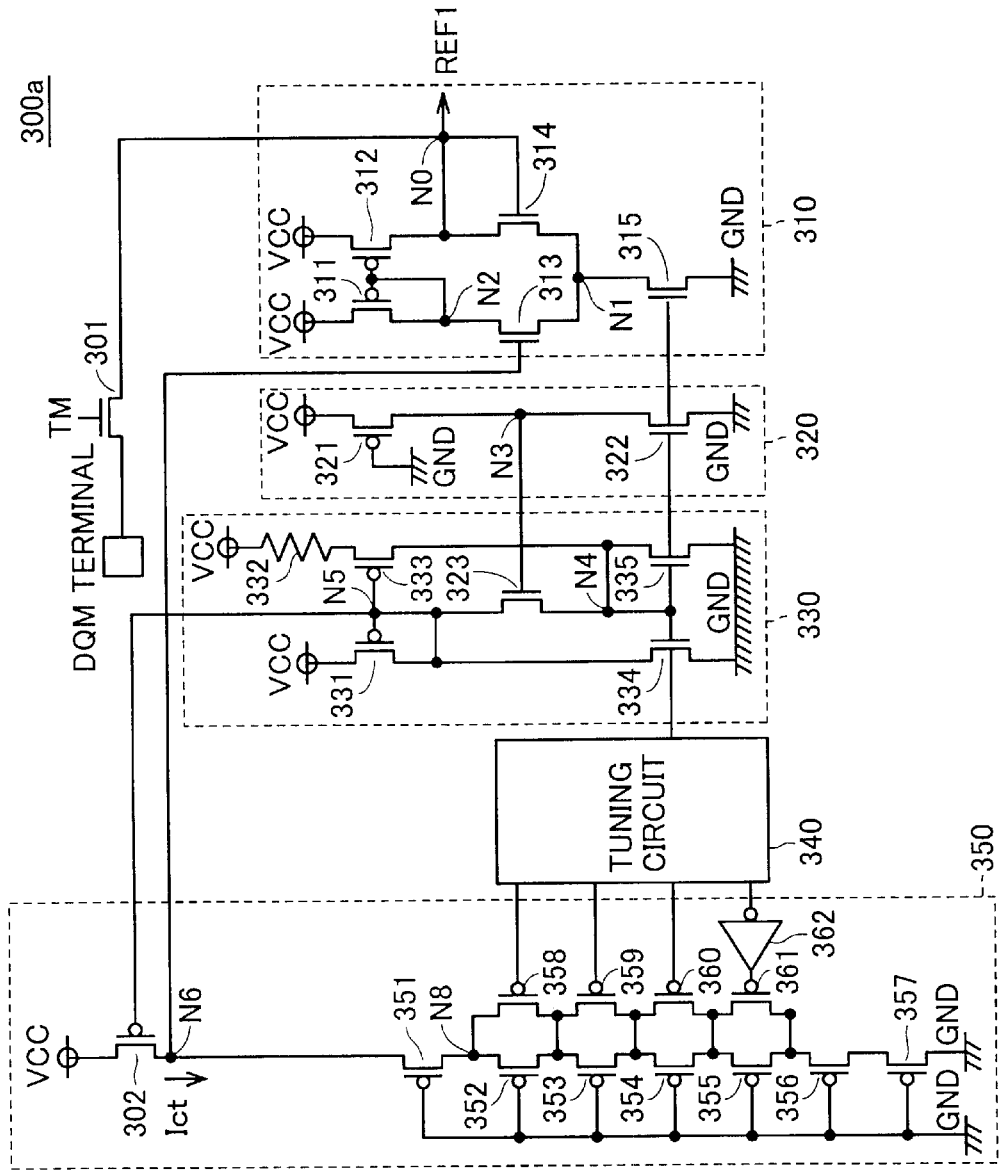
FIG. 9 is a circuit block diagram of reference voltage generation circuit 300*a* which generates reference voltage REF1.
Figure 10:
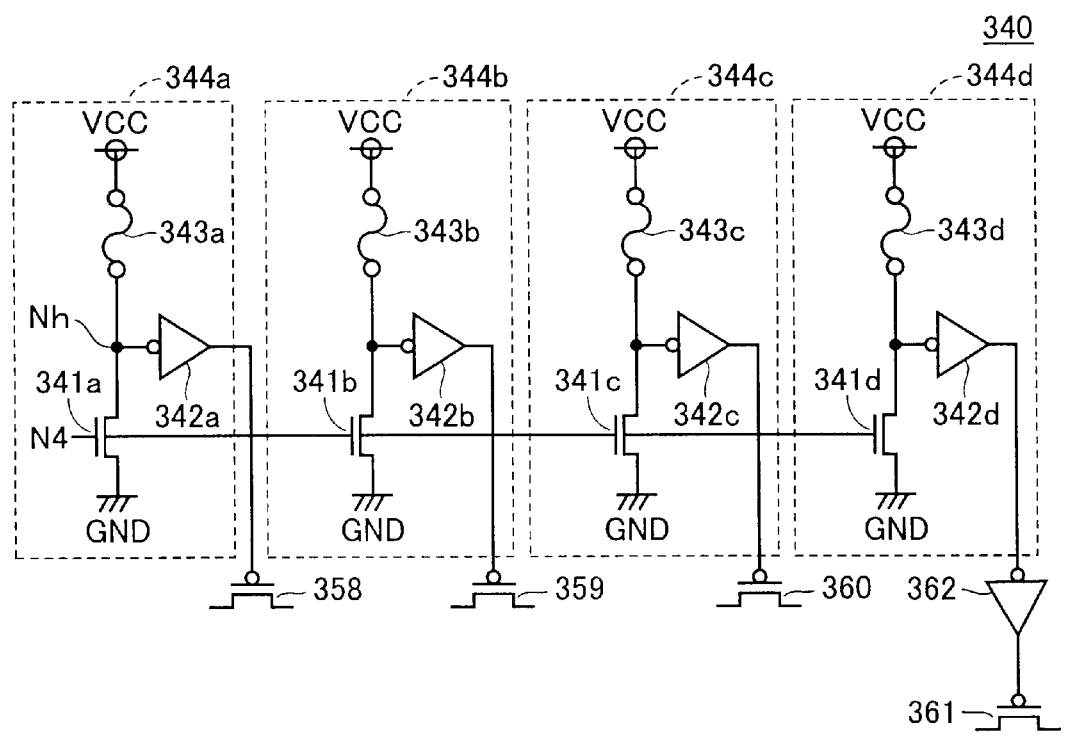
FIG. 10 is a circuit block diagram of tuning circuit 340.

Referring to FIG. 5, reference voltage generation circuit 300#a differs from reference voltage generation circuit 300a in the conventional art shown in FIG. 9 in that a counter section 390 is further provided and that reference voltage setting circuit 350 is replaced by a reference voltage setting circuit 380.

Reference voltage setting circuit 380 differs from reference voltage setting circuit 350 in that a test voltage setting circuit 370 which sets the level of the reference voltage during a test is further provided. Since the remaining constituent circuits are the same as those described with reference to FIG. 9, they will not be repeatedly described herein in detail.

Test voltage setting circuit 370 is intended to raise or lower constant voltage Vn6 in a normal state step by step.

Test voltage setting circuit 370 includes P-channel MOS transistors 371 to 378 and an inverter 379.

P-channel MOS transistors 371 to 374 are connected in series between internal node N6 and P-channel MOS transistor 352 and the respective gates of P-channel MOS transistors 371 to 374 are connected to ground voltage GND. Therefore, P-channel MOS transistors 371 to 374 function as resistance elements as in the case of P-channel MOS transistors 353 to 356 described above.

Further, P-channel MOS transistors 375 to 378 are provided to correspond to P-channel MOS-transistors 371 to 374, and to function as transistor switches which short-circuit corresponding P-channel MOS transistors, respectively. The gate of each of P-channel MOS transistors 375 to 378 is controlled by input from counter section 390. It is noted, however, the gate of P-channel MOS transistor 378 receives the input of the inverted signal of the output signal of counter section 390 through inverter 379.

It is assumed that signals inputted from counter section 390 are all at "L" level in normal operation. Following this, it is set that only P-channel MOS transistor 374 functions as a resistance element in normal operation. If so setting, during a test, as in the case of the tuning operation of tuning circuit 340 described above, the combined channel resistance of P-channel MOS transistors 371 to 374 which function as resistance elements is adjusted by counter section 390 and constant voltage Vn6 which is at the voltage level of internal node N6 is set. According to the present invention, therefore, it is possible to further increase or decrease the voltage level of constant voltage Vn6 employed in the normal operation, during a test.

For example, it is assumed that the channel resistance ratio of P-channel MOS transistors 371 to 374 is 1:2:4:8. It is also assumed that the combined channel resistance of the channel resistances of test voltage setting circuit 370 is Rd. In an initial state, it is assumed that P-channel MOS transistors 375 to 377 are conductive and that P-channel MOS transistor 378 is nonconductive. Only P-channel MOS transistor 374 functions as a resistance element.

Accordingly, if P-channel MOS transistor 378 is made conductive, the value of combined resistance Rd falls from the initial state. Conversely, if P-channel MOS transistor 375 is made nonconductive, the value of combined resistance Rd rises from the initial state. By allowing counter section 390 to selectively make P-channel MOS transistors 375 to 378 conductive or nonconductive, it is possible to increase or decrease constant voltage Vn6 during a test step by step.

It has been described in connection with reference voltage generation circuit 300a shown in FIG. 9 that tuning circuit 340 adjusts combined channel resistance Rc of P-channel MOS transistors 352 to 355 and thereby corrects the deviation of the target level of the reference voltage set in a design phase. According to the present invention, in an initial state, since P-channel MOS transistor 374 in test voltage setting circuit 370 functions as a resistance element in the normal operation, tuning circuit 340 adjusts combined channel resistance Rc to which the channel resistance of P-channel MOS transistor 374 is further added, and thereby executes tuning for correcting the deviation of the reference voltage set in a design phase.

Counter section 390 includes counters 500a to 500d.

Counter section 390 executes the tuning of test voltage setting circuit 370 in accordance with the input of up indication signal UP, down indication signal DN and test mode signal TM.

Each of counters 500a to 500d receives the input of up indication signal UP, down indication signal DN, test mode signal TM and a counter input signal CIN, and generates an output signal OUT and a counter output signal COUT.

In addition, output signals OUT of counters 500a to 500d are transmitted to the gates of P-channel MOS transistors 375 to 378 serving as transistor switches, respectively.

Further, counter output signal COUT of counter 500a is inputted into next counter 500b as a counter input signal. Likewise, counter output signals COUT of counters 500b and 500c are inputted into next counters as counter input signals CIN, respectively. It is noted that power supply voltage VCC, i.e., "H" level voltage is always inputted as counter input signal CIN of counter 500a.

Since counters 500a to 500d are equal in configuration, counter 500a will be typically described.

Figure 6:
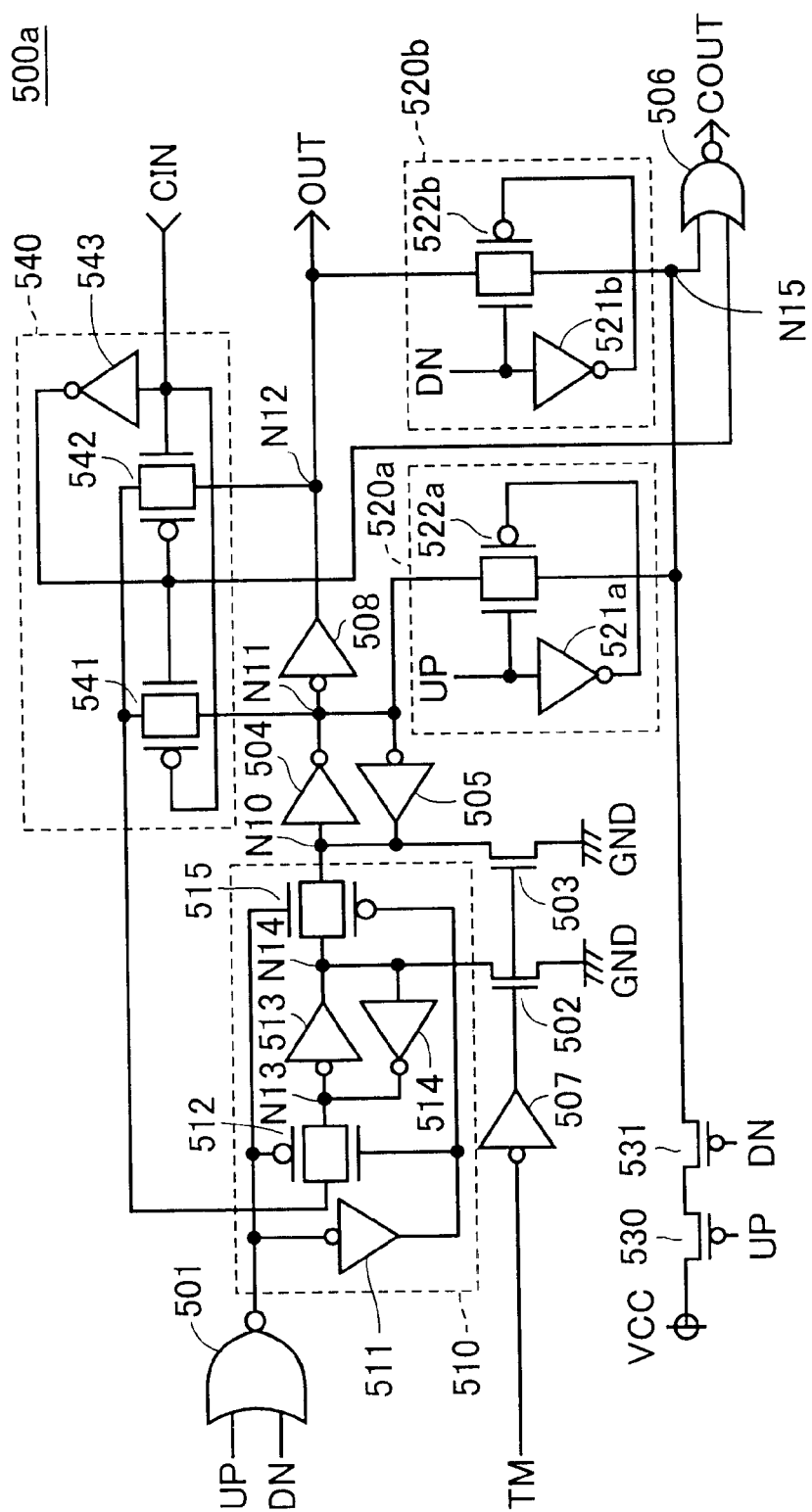
FIG. 6 is a circuit block diagram of a counter.
Figure 8:
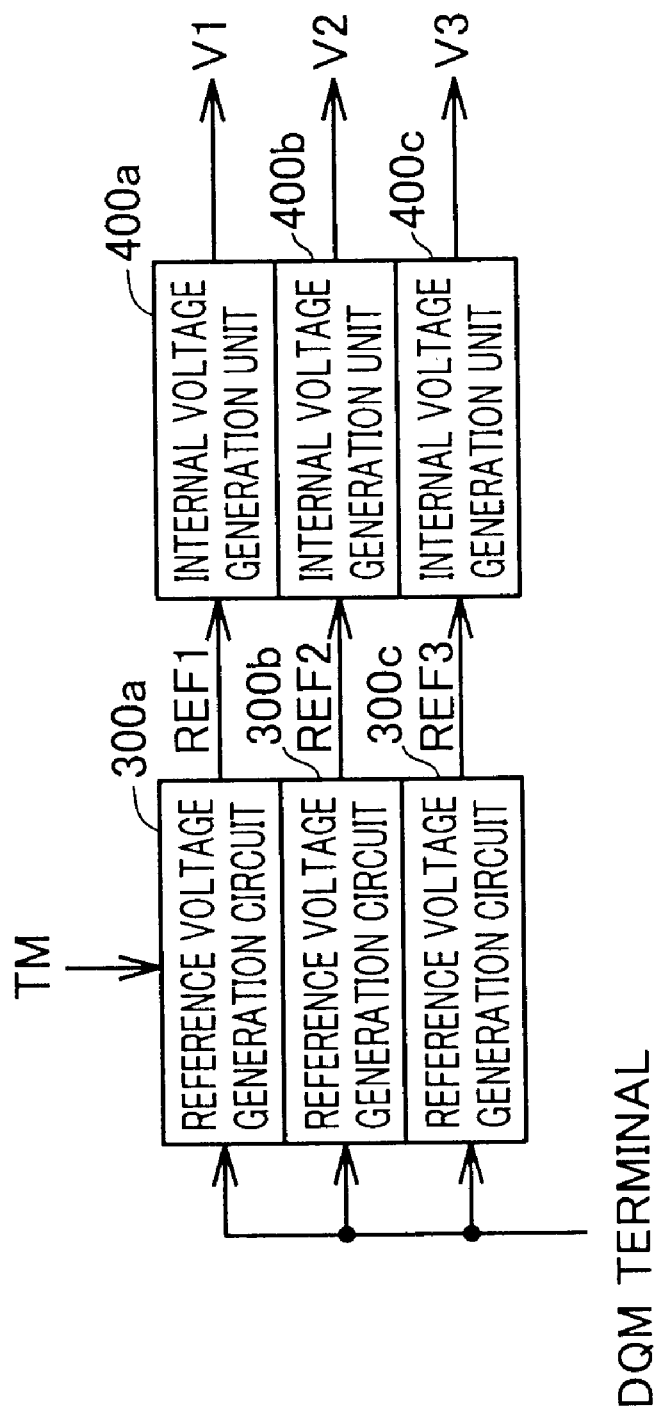
FIG. 8 is a conceptual view of conventional internal voltage generation circuit 20 which generates internal voltages.

FIG. 6 is a circuit block diagram of counter 500a.

Referring to FIG. 6, counter 500a includes NOR circuits 501 and 506, gate circuits 520a, 520b and 540, a latch control circuit 510, inverters 504, 505, 507 and 508, N-channel MOS transistors 502 and 503, and P-channel MOS transistors 530 and 531.

Gate circuit 540 outputs one of the signals transmitted to nodes N11 and N12 to latch control circuit 510 in response to counter input signal CIN. Gate circuit 540 includes transfer gates 541 and 542, and an inverter 543.

The gates of transfer gates 541 and 542 receive counter input signal CIN and an inverted signal through inverter 543 and are complementarily turned on/off.

If counter input signal CIN is, for example, at "H" level, the signal transmitted to node N12 is outputted to latch control circuit 510. If counter input signal CIN is at "L" level, the signal transmitted to node N11 is outputted to latch control circuit 510.

NOR circuit 501 receives the input of up indication signal UP and down indication signal DN, outputs a NOR logic operation result and thereby activates latch control circuit 510.

Latch control circuit 510 latches the signal outputted from gate circuit 540 in response to the logic operation result of NOR circuit 501. Latch control circuit 510 includes transfer gates 512 and 515, and inverters 511, 513 and 514.

Transfer gates 512 and 515 receive an output signal from NOR circuit 501 and the inverted signal thereof through inverter 511 and are complementarily turned on/off. Transfer gate 512 transmits the signal outputted from gate circuit 540 to a node N13 in response to a NOR logic operation result. Inverter 513 inverts the signal transmitted to node N13 and transmits the inverted signal to a node N14, and inverter 514 inverts the signal transmitted to node N 14 and transmits the inverted signal to node N13. Therefore, two inverters 513 and 514 form a latch circuit. Transfer gate 515 transmits the signal transmitted to node N14, to a node N10 in response to a NOR logic operation result. It is noted that inverter 514 is inferior to inverter 513 in driving capability. That is, latch control circuit 510 latches the output signal from gate circuit 540 in response to the rise of one of up indication signal UP and down indication signal DN, and outputs the latched signal in response to the fall thereof.

Inverter 504 inverts the signal transmitted to node N10 and transmits the inverted signal to node N11, and inverter 505 inverts the signal transmitted to node N11 and transmits the inverted signal to node N10. Therefore, two inverters 504 and 505 form a latch circuit. Inverter 508 inverts the signal transmitted to node N11 and transmits the inverted signal to node N12 as output signal OUT. It is noted that inverter 505 is inferior to inverter 504 in driving capability.

Gate circuit 520a includes a transfer gate 522a and an inverter 521a, and transmits the signal transmitted to node N11 to a node N15 which is one of the input sides of NOR circuit 506, in response to up indication signal UP. Gate circuit 520b includes a transfer gate 522b and an inverter 521b, and transmits the signal transmitted to node N12 to node N15 which is one of the input sides of NOR circuit 506 in response to down indication signal DN.

P-channel MOS transistors 530 and 531 are connected in series between power supply voltage VCC and node N15 and the gates of P-channel MOS transistors 530 and 531 receive up indication signal UP and down indication signal DN, respectively. Therefore, since up indication signal UP and down indication signal DN are both at "L" level in operations other than test operation, node N15 is always set at "H" level by power supply voltage VCC. Accordingly, counter output signal COUT outputted from NOR circuit 506 is set at "L" level in an initial state.

N-channel MOS transistors 502 and 503 are connected between ground voltage GND and node N14 and between ground voltage GND and node N10, respectively, the respective gates of N-channel MOS transistors 502 and 503 receive the input of test mode signal TM through inverter 507. Namely, when test mode signal TM is at "L" level, i.e., in the initial state, nodes N14 and N10 are fixed to "L" level. Output signal OUT is, therefore, set at "L" level.

By way of example, the operation of counter section 390 if the level of reference voltage REF1 is raise by one step (which will be also referred to as "level+1") during a test, i.e., when test mode signal TM is at "H" level, will be described. In the initial state, output signals OUT of counters 500a to 500d are all at "L" level.

In counter 500a, if up indication signal UP is inputted, then transfer gate 542 becomes conductive, the signal transmitted to node N12 is inputted into and latched by latch control circuit 510. That is, in the initial state, the voltage level of node Nil is "H" level and that of node N12 is "L" level. The voltage level of node N14 is, therefore, latched to "H" level.

In addition, in counter 500a, if up indication signal UP is inputted, then gate circuit 520a becomes active, the voltage signal transmitted to node N11 is inputted into NOR circuit 506 and the level of counter output signal COUT which indicates the NOR logic operation result becomes "L" level. Accordingly, in counter 500b, since counter input signal CIN is at "L" level, transfer gate 541 included in gate circuit 540 becomes conductive and node N14 is latched to "L" level by latch control circuit 510.

Moreover, the level of counter output signal COUT which indicates the NOR logic operation result of NOR circuit 506 becomes "L" level.

Likewise, as for counters 500c and 500d, the level of each counter output signal COUT becomes "L" level and node N14 is latched to "L" level in each latch control circuit 510.

Next, counter 500a transmits the signal latched by latch control circuit 510, to node N12 in response to the fall of up indication signal UP. That is, output signal OUT is set at "H" level. As for counters 500b to 500d, the signal latched by each latch circuit 510 is transmitted to node N12 and each output signal OUT is set at "L" level.

Referring back to FIG. 5, as described by way of example, if the channel resistance ratio of P-channel MOS transistors 371 to 374 is assumed as 1:2:4:8, then P-channel MOS transistors 375 and 378 become nonconductive and P-channel MOS transistors 376 and 377 become conductive in response to up indication signal UP and combined channel resistance Rd, therefore, increases. Following this, as described above, constant voltage Vn6 rises by a voltage ΔV which corresponds to the product between constant current Ict and the increase of combined channel resistance Rd, whereby the reference voltage during a test can be raised by one step from the initially set reference voltage.

If the above-stated concrete example is used, combined channel resistance Rd increases step by step and it is, therefore, possible to raise reference voltage REF1 from an initial state level 0 to level+7 step by step as shown in FIG. 7A.

If the above-stated concrete example is used, as shown in FIG. 7B, combined channel resistance Rd decreases step by step. It is, therefore, possible to lower reference voltage REF1 from initial level 0 to level−7 step by step during a test.

By adopting the above-stated configuration, it is possible to increase or decrease combined channel resistance Rd of test voltage setting circuit 370 step by step in response to up indication signal UP and down indication signal DN, respectively. It is, therefore, possible to raise or lower the voltage level of constant voltage Vn6 of internal node N6 step by step during a test. Accordingly, it is possible to set the voltage level of the internal voltage to follow that of the reference voltage, as well.

By adopting the configuration of the present invention, the voltage level of reference voltage REF1 is raised or lowered step by step based on a binary input signal without increasing the number of external terminals. It is thereby possible to adjust the internal voltages during a test and to efficiently execute a screening test.

While the configuration in which P-channel MOS transistors are employed as transistors which function as resistance elements has been described so far, it is also possible to adopt a configuration in which N-channel MOS transistors which function as resistance elements are employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    an internal voltage generation circuit controlling an internal voltage supplied to an internal circuit in accordance with a reference voltage;
    a reference voltage generation circuit generating said reference voltage;
    a plurality of signal terminals each for communicating a signal with an outside of said semiconductor memory device; and
    a reference voltage change indication circuit for indicating a change of said reference voltage on the basis of a binary input signal to each of said signal terminals with respect to said reference voltage generation circuit during a test.

2. The semiconductor memory device according to claim 1, wherein
    during said test, said plurality of signal terminals receive inputs of a plurality of first control signals and a second control signal, and
    if a predetermined combination of said plurality of first control signals is inputted during said test, said reference voltage change indication circuit indicates the change of said reference voltage on the basis of said second control signal.

3. The semiconductor memory device according to claim 2, wherein
    said plurality of first control signals and said second control signal are used to indicate an operation of said semiconductor memory device in a normal operation.

4. The semiconductor memory device according to claim 1, wherein
    said reference voltage generation circuit changes in stages said reference voltage into one of that in a higher range and that in a lower range than that in the normal operation in accordance with an indication from said reference voltage change indication circuit based on said input signal during said test.

5. The semiconductor memory device according to claim 4, wherein
    said reference voltage generation circuit includes:
        a first resistance section and a second resistance section connected in series between a first voltage and a second voltage;
        a current supply section for supplying a passing current to said first and second resistance sections;

a voltage generation section generating said reference voltage in accordance with a sum of respective voltage drops of said first and second resistance sections; and a resistance setting section setting a resistance value of said second resistance section, said first resistance section has:
  a plurality of resistance elements connected in series; and
  a plurality of transistor switches provided corresponding to said plurality of resistance elements, respectively, and each for short-circuiting corresponding one of said resistance elements, at least one of said plurality of transistor switches being turned off in the normal operation, during said test, each of said transistor switches being allowed to be turned on and off selectively, and wherein
  in said normal operation, said resistance setting section sets the resistance value of said second resistance section so that the sum of the respective voltage drops of said first resistance section and said second resistance section corresponds to said reference voltage in said normal operation.

* * * * *

UNITED STATES PATENT AND TRADEMARK OFFICE
CERTIFICATE OF CORRECTION

PATENT NO. : 6,654,300 B2
DATED : November 25, 2003
INVENTOR(S) : Yutaka Ikeda

It is certified that error appears in the above-identified patent and that said Letters Patent is hereby corrected as shown below:

Title page,
Item [73], Assignee, change "Mitsubishi Denki Kabushiki Kaisha" to
-- Renesas Technology Corp. --.

Signed and Sealed this

Second Day of March, 2004

JON W. DUDAS
*Acting Director of the United States Patent and Trademark Office*